US008815638B2

(12) United States Patent
Ozawa

(10) Patent No.: US 8,815,638 B2
(45) Date of Patent: Aug. 26, 2014

(54) METHOD OF MANUFACTURING THICK-FILM ELECTRODE

(71) Applicant: E I du Pont de Nemours and Company, Wilmington, DE (US)

(72) Inventor: Kazutaka Ozawa, Kanagawa (JP)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 13/915,681

(22) Filed: Jun. 12, 2013

(65) Prior Publication Data

US 2013/0337604 A1    Dec. 19, 2013

Related U.S. Application Data

(60) Provisional application No. 61/661,509, filed on Jun. 19, 2012.

(51) Int. Cl.
*H01L 31/18* (2006.01)
*H01L 31/0224* (2006.01)
*H01B 1/22* (2006.01)

(52) U.S. Cl.
CPC ........ *H01L 31/18* (2013.01); *H01L 31/022441* (2013.01); *H01L 31/022425* (2013.01); *H01B 1/22* (2013.01)
USPC ............................................ 438/98; 252/514

(58) Field of Classification Search
None
See application file for complete search history.

(56) References Cited

U.S. PATENT DOCUMENTS

| 4,127,424 | A  | * | 11/1978 | Ullery, Jr. ................ 136/244 |
| 2006/0272700 | A1 | * | 12/2006 | Young et al. .............. 136/256 |
| 2007/0187652 | A1 | * | 8/2007 | Konno ...................... 252/500 |
| 2008/0178930 | A1 |   | 7/2008 | Konno |
| 2011/0120551 | A1 | * | 5/2011 | Prince et al. .............. 136/256 |

* cited by examiner

Primary Examiner — Charles Garber
Assistant Examiner — Alia Sabur

(57) ABSTRACT

A method of manufacturing a thick-film electrode comprising the steps of: applying onto a substrate a conductive paste comprising a conductive powder, a glass frit, 3.5 to 12.5 weight percent of an organic polymer, and a solvent, wherein the weight percent is based on the total weight of the conductive powder, the glass frit, and the organic polymer; firing the applied conductive paste to form the thick-film electrode, wherein thickness of the thick-film electrode is 1 to 10 μm; and soldering a wire to the thick-film electrode.

12 Claims, 2 Drawing Sheets

METHOD OF MANUFACTURING THICK-FILM ELECTRODE

CROSS-REFERENCE TO RELATED APPLICATION

This application claims the benefit of U.S. Provisional Application No. 61/661,509, filed Jun. 19, 2012.

FIELD OF THE INVENTION

The invention relates to a method of manufacturing a thick-film electrode.

TECHNICAL BACKGROUND OF THE INVENTION

A thick-film electrode which conventionally has tens of microns thickness needs to be thinner as electrical devices get down-sized or as material consumption needs to be reduced. However, it is well known that a thick-film electrode with insufficient thickness has poor solder adhesion.

US20080178930 discloses a conductive paste to form a bus electrode of 20 to 30 μm thick on the back side of the solar cell. The conductive paste contains 40 to 93 weight percent (wt %) of Ag particles with particle diameter of 3.0 to 15.0 μm; and 2 to 10 wt % of glass particles; dispersed in 5 to 50 wt % of an organic vehicle.

SUMMARY OF THE INVENTION

An objective is to provide a method of manufacturing an electrode which has 1 to 10 μm thickness as well as sufficient solder adhesion.

An aspect relates to a method of manufacturing a thick-film electrode comprising the steps of: applying onto a substrate a conductive paste comprising a conductive powder, a glass frit, 3.5 to 12.5 weight percent (wt %) of an organic polymer, and a solvent, wherein the wt % is based on the total weight of the conductive powder, the glass frit, and the organic polymer; firing the applied conductive paste to form the thick-film electrode, wherein the thickness of the thick-film electrode is 1 to 10 μm; and soldering the thick-film electrode.

Another aspect relates to a method of manufacturing a solar cell comprising steps of: preparing a silicon wafer having a front side and a back side, wherein an insulating layer comprising silicon nitride ($SiN_x$), titanium oxide ($TiO_2$), aluminum oxide ($Al_2O_3$), silicon oxide ($SiO_2$), or indium tin oxide (ITO) is formed on the front side, applying onto at least either of the front side and the back side a conductive paste comprising a conductive powder, a glass frit, 3.5 to 12.5 wt % of an organic polymer, and a solvent, wherein the wt % is based on the total weight of the conductive powder, the glass frit, and the organic polymer; firing the applied conductive paste to form the thick-film electrode as a bus electrode of the solar cell, wherein the thickness of the thick-film electrode is 1 to 10 μm; and soldering the thick-film electrode with a wire to electrically connect the solar cell to another solar cell.

Another aspect relates to a conductive paste to form a thick film electrode with 1 to 10 μm thickness comprising a conductive powder, a glass frit, 3.5 to 12.5 wt % of an organic polymer, and a solvent, wherein the wt % is based on the total weight of the conductive powder, the glass frit and the organic polymer.

The solder adhesion of a thick-film electrode with 1 to 10 μm thickness can be improved by the present invention.

DETAILED DESCRIPTION OF THE INVENTION

Figure 1A:
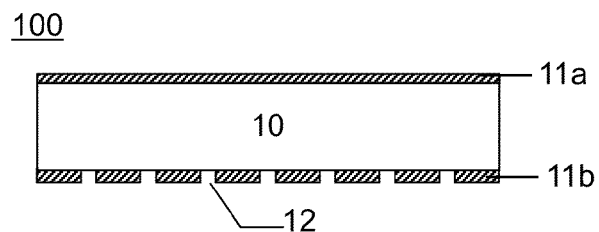
FIG. 1A to 1D explain a process of manufacturing a solar cell electrode.

The thick-film electrode is formed with a conductive paste. The conductive paste contains inorganic powder dispersed into an organic medium to form a "paste", having suitable viscosity for applying on a substrate. The method of manufacturing the thick-film electrode and the conductive paste to form thick-film electrode is explained respectively below.

Method of Manufacturing a Thick-Film Electrode

The thick-film electrode is formed by applying the conductive paste onto the substrate, optionally drying the applied conductive paste, and firing the dried conductive paste.

The way of applying the conductive paste on the substrate can be screen printing, nozzle discharge, or off-set printing.

Any type of substrate on which the conductive paste can be applied can be used. For example, a metal substrate, a ceramic substrate, a glass substrate, or a semiconductor substrate can be used as the substrate. The substrate can comprise an insulating layer formed on at least one side surface of the substrate.

Especially when the substrate is a metal substrate containing a metal layer, the insulating layer can be formed on a side, on which the thick-film electrode is formed, of the metal layer.

When the substrate is a semiconductor substrate containing a semiconductor layer, the insulating layer is not always necessary to be formed on the semiconductor layer. The thick-film electrode can be directly formed on the semiconductor layer, or the thick-film electrode can be formed on the insulating layer of the semiconductor substrate. In an embodiment, the semiconductor substrate can comprise a semiconductor layer and an insulating layer on at least one side surface of the semiconductor layer.

The conductive paste applied on the substrate can be optionally dried. When the applied conductive paste is dried, the solvent in the conductive paste is evaporated so that the conductive paste can be hardened and firmly fixed on the substrate. However, the applied conductive paste can be also directly fired without having the drying step.

The drying condition can be adjusted depends on the evaporation characteristics of the solvent. In an embodiment, the drying temperature can be 60 to 350° C. in an embodiment, 100 to 260° C. in another embodiment, 120 to 200° C. in another embodiment. The drying time can be 10 seconds to 30 minutes in an embodiment, 1 minute to 15 minutes in another embodiment.

There is no restriction on the firing condition. The firing process can be carried out in a furnace. The firing condition can vary depending on the substrate type or properties of the conductive paste. However, the thick-film electrode can be generally obtained by firing the conductive paste at a setting peak temperature of 400 to 1000° C. in an embodiment, 520 to 980° C. in another embodiment, or 600 to 900° C. in still another embodiment. The firing time can be 10 seconds to 1 hour in one embodiment and 30 seconds to 40 minutes in another embodiment.

The thick-film electrode obtained after the firing is 1 to 10 μm thick. In another embodiment, the electrode can be 1.5 to 8.5 μm thick, in still another embodiment 2 to 6.9 μm thick, and in yet another embodiment 2.5 to 6 μm thick. The thick-film electrode with such thickness can be thin enough to be used in a small electrical device or can contribute to reduction of the materials use.

The thick-film electrode is soldered to electrically interconnect with another electrical device. A solder ribbon, for example a copper coated with solder of Sn/Pb/Ag, Sn/Pb or Pb-free Sn/Bi can be used. Solder condition can be typically at 200 to 350° C. for 5 seconds with a flux that is mildly activated or not activated.

The thick-film electrode has sufficient solder adhesion so that the electrode can be hardly taken off from the substrate. The solder adhesion can be measured with a machine, for example Peel Force 606 (MOGRL Technology Co., Ltd.).

The thick-film electrode can be used in any electrical device, for example a resistor, a capacitor, a circuit on substrate, a semiconductor device such as a LED device or a solar cell.

Figure 4:
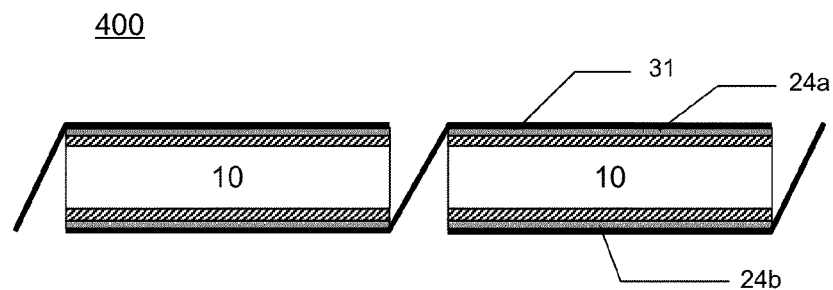
FIG. 4 is a cross-sectional diagram of a solar cell module.

One of the examples of the electrical device that uses the thick-film electrode can be a solar cell. The solar cell has a bus electrode to electrically interconnect solar cells by soldering a metal wire such as a solder ribbon. In an embodiment, the bus electrode 24a on the front side of a solar cell is connected to another bus electrode 24b on the back side of the next solar cell by soldering the metal wire 31 and thereby forming the solar cell module 400 as illustrated in FIG. 4.

An example of manufacturing a solar ell is explained referring to FIG. 1A to 1D. The solar cell in the example is a Passivated Emitter and Rear Cell (PERC) which is characterized by insulating layers on the back side surface and the front side surface of a semiconductor layer. However, the present invention is not limited to this example.

A semiconductor substrate 100 comprising a semiconductor layer 10, e.g., a silicon wafer (FIG. 1A). The semiconductor substrate 100 can further comprise a first insulating layer 11a on the front side surface and a second insulating layer 11b on the back side surface of the semiconductor layer 10. The insulating layer functions as a passivation layer, moreover as an anti-reflection coating (ARC) when it is formed on the front side.

In the specification, "front side" is the light-receiving side when the solar cell is actually installed to generate electricity, and "back side" is the opposite side of the front side.

Silicon nitride ($SiN_x$), titanium oxide ($TiO_2$), aluminum oxide ($Al_2O_3$), silicon oxide ($SiO_2$), or indium tin oxide (ITO) can be used as a material of the insulating layers 11a and 11b. The insulating layers can be formed by sputtering, plasma-enhanced chemical vapor deposition (PECVD), or a thermal CVD or plasma CVD. A multiple layer configuration can be also available, for example two layers of silicon nitride/silicon oxide or silicon nitride/aluminum oxide. The thickness of the insulating layers 11a and 11b can be 10 to 500 nm.

In PERC, the insulating layer 11b on the back side can have openings 12 at which the semiconductor layer surface is exposed so that the electrode on the back side can be electrically in contact with the semiconductor layer at the openings. To make the openings 12, the insulating layer 12 can be formed on the entire surface of the back side and then partially removed, for example by laser ablation. Area of the openings 12 can be 0.1 to 50% of the area of the back surface of the semiconductor area in an embodiment.

However, the openings 12 are not essential. When partially applying a conductive paste which is capable of firing through the insulating layer 11b, or in case of Laser Fired Contact (LFC) whereby a laser pulse drives the electrode through the insulator and into the semiconductor layer, the openings are not necessary.

Figure 1B:
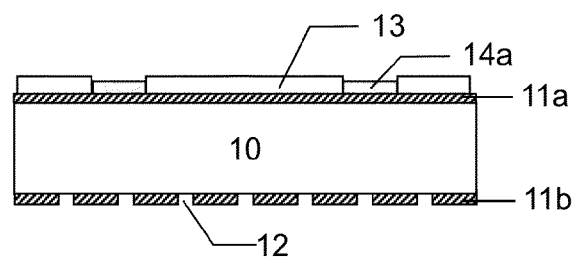

On the front side, a first conductive paste 13 to form finger lines and a second conductive paste 14a to form a bus electrode can be applied onto the front side of the semiconductor substrate 100 (FIG. 1B). There is no restriction on the order of applying the first conductive paste and the second conductive paste. The first conductive paste 13 can be applied first and then the second conductive paste 14a can be applied over the first conductive paste 13 in an embodiment. The second conductive paste can be the same as the first conductive paste and can be applied simultaneously in an embodiment.

When the insulating layer 11a is formed on the front side, the first conductive paste 13 can be capable of firing through the first insulating layer 11a during firing to electrically contact with the semiconductor layer 10. The second conductive paste 14a is not necessary to be always capable of firing through the first insulating layer 11a, because the main role of the bus electrode is to convert the electricity generated in the semiconductor substrate 100 and taken out by the finger lines. However, the second conductive paste 14a can be capable of firing through as well as the first conductive paste 13.

Figure 1C:
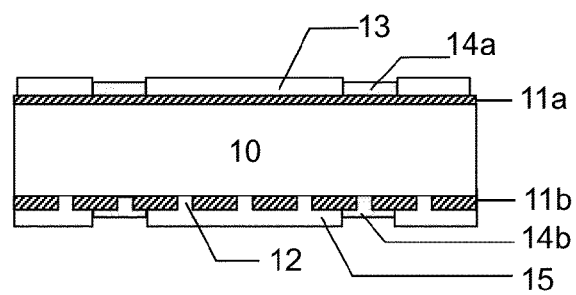

On the back side, a third conductive paste 14b to form a bus electrode and an aluminum (Al) paste 15 to form an Al electrode can be applied onto the back side of the semiconductor substrate 100 as illustrated in FIG. 1C. There is also no restriction on the order of applying the third conductive paste 14b and the Al paste 15. In an embodiment, the third conductive paste 14b can be applied on the semiconductor substrate first and then the Al conductive paste 15 can be applied at the rest of the area of the back side surface.

Figure 1D:
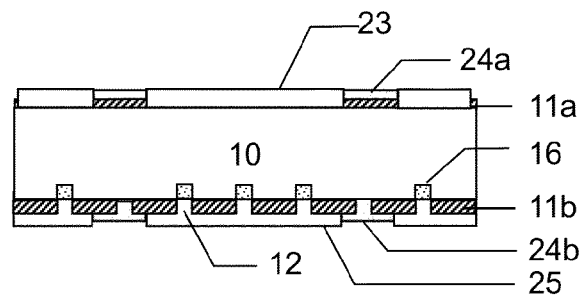

The Al paste 15 is applied on the insulating layer 12 to cover the openings 12 as illustrated in FIG. 10 so that aluminum in the Al paste 15 disperses into the semiconductor layer 10 to form Back Surface Field (BSF) 16 during firing as illustrated in FIG. 1D.

The pastes 13, 14a, 14b and 15 on the semiconductor substrate 100 can be dried. In an embodiment, the drying condition can be 70 to 380° C. for 0.1 to 20 minutes to dry up the solvent contained in the paste. However, the applied conductive paste can be directly fired without having the drying step.

The dried first conductive paste 13 forms the finger lines and can be 30 to 50 μm thick. The dried second and third conductive pastes 14a and 14b form the bus electrodes on the front side and the back side respectively and can be 2 to 20 μm thick.

The dried Al paste 15 can be 20 to 40 μm thick.

The dried second conductive paste 14a comprises 86 to 98 wt % of the conductive powder based on the weight of the dried second conductive paste in one embodiment, 86.5 to 97 wt % in another embodiment, 87.5 to 96 wt % in yet another embodiment and 88 to 94 wt % in still another embodiment, based on the weight of the dried second conductive paste.

The dried third conductive paste 14b comprises 86 to 98 wt % of the conductive powder in one embodiment, 86.5 to 97 wt % in another embodiment, 87.5 to 96 wt % in a further embodiment, 88 to 94 wt % in yet another embodiment, and 89 to 93 wt % in still another embodiment, based on the weight of the dried third conductive paste 14b.

When the dried second and third conductive pastes 14a and 14b contain the conductive powder in the ranges indicated, the adhesion of the bus electrode can increase as shown in the Examples below.

Finger lines 23, a front-side bus electrode 24a, a back-side bus electrode 24b and an Al electrode 25 are obtained by firing the dried first conductive paste 13, the dried second conductive paste 14a, the dried third conductive paste 14b and the dried Al paste 15, respectively, as illustrated in FIG. 1D.

The first conductive paste 13 can be capable of firing through the first insulating layer 11a during firing so that the finger lines 23 can electrically contact with the semiconductor layer 10. The second conductive paste 14a and the third conductive paste 14b do not fire through the first insulating layers 11a and the second insulating layer 11b respectively as well as the Al paste 15 in FIG. 1D. However, in another embodiment, the second conductive paste 14a and the third conductive paste 14b can be capable of firing through the insulating layer 11a and 11b, respectively, so that the bus electrodes 24a and 24b can contact with the semiconductor layer 10.

Firing can be carried out by using a furnace, with the peak setting temperature of 600 to 1000° C. for 1 second to 15 minutes. In another embodiment, the peak setting temperature can be from 400 to 600° C. for 5 seconds to 23 minutes, and over 600° C. for 3 seconds to 19 minutes. Total firing time can be 10 seconds to 30 minutes in one embodiment, 20 seconds to 15 minutes in another embodiment and 30 seconds to 5 minutes in still another embodiment. When firing with such conditions, the electrodes can be formed with less damage to the semiconductor layer. The firing time can be counted, for example, from entrance to exit of the furnace.

The finger lines 23 can be 15 to 40 μm thick. The Al electrode 25 can be 20 to 30 μm thick. The thickness of the bus electrodes is the same as described above.

In the explanation above, the pastes on the front side and the back side are fired at the same time, which is called co-firing. With co-firing, the process can be shorter and simpler to reduce production cost. Alternatively, the pastes on the front side, the first conductive paste 13 and the second conductive paste 14a and the pastes on the back side, the third conductive paste 14b and the Al paste 15, can be fired separately, for example applying and firing the pastes 14b and 15 on the back side first and then applying and firing the pastes 13 and 14a on the front side with different firing profiles. Firing separately is effective especially when a suitable firing condition is different for each paste.

In an embodiment, the front-side bus electrode 24a and the back-side bus electrode 24b can be formed by the present invention.

In another embodiment, the back-side bus electrode 24b can be formed by the present invention and the front-side bus electrode 24a can be formed with the same conductive paste as the finger lines 23. When forming the finger lines 23 and the front-side bus electrode 24a with the same conductive paste, the manufacturing process can be simpler.

Figure 2:
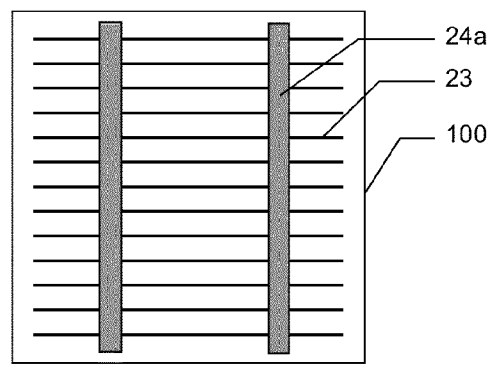
FIG. 2 is a schematic diagram of the front side of a solar cell.

An example of the pattern of the finger lines 23 and the front-side bus electrode 24a can be comb shape with two lines of the front-side bus electrode 24a and finger lines 23 formed at the both sides of the bus electrode 24a as illustrated in FIG. 2.

Figure 3:
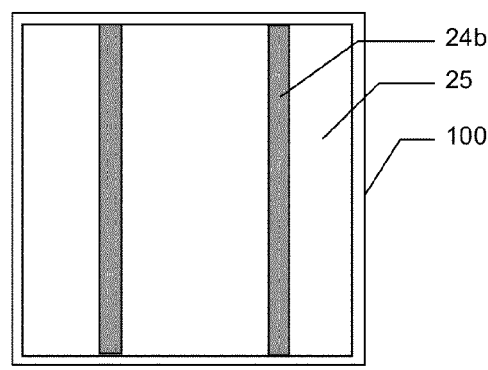
FIG. 3 is a schematic diagram of the back side of a solar cell.

The pattern of the electrode on the back side can be of two lines of the back-side bus electrode 24b and the Al electrodes 25 cover the rest of the back side surface of the substrate 100 as illustrated in FIG. 3. The back-side bus electrodes 24b and the Al electrodes 25 can be partially over lapped at the border of these electrodes.

Although the example of the PERC is explained above, the present invention can be available in other types of solar cell such as a solar cell having the semiconductor substrate with the passivation layer only on the front side; and a back contact type of a solar cell having just a front-side passivation layer and electrodes on the back side.

When the semiconductor substrate 100 has no insulating layer 11b on the back side, the back-side bus electrode 24b is formed directly on the semiconductor layer 10.

The conductive paste for manufacturing the thick-film electrode is explained in detail below.

Conductive Paste

The conductive paste contains a conductive powder, a glass frit, an organic polymer, and a solvent.

Conductive Powder

The conductive powder is any powder that enables the thick-film electrode to transport electrical current. The conductive powder can comprise a metal selected from the group consisting of silver (Ag), nickel (Ni), copper (Cu), gold (Au), platinum (Pt), palladium (Pd), aluminum (Al) and a mixture thereof in an embodiment. With this conductive powder, the thick-film electrode can have a sufficient electrical property.

The conductive powder can comprise a metal powder selected from the group consisting of Ag element powder, Ni element powder, Cu element powder, Au element powder, Pt element powder, Pd element powder, Al element powder and a mixture thereof in another embodiment. The purity of the metal element powder is more than 95 wt % in an embodiment, more than 97 wt % in another embodiment, and more than 99 wt % in still another embodiment.

In another embodiment, the conductive powder can be a metal powder containing Ag, for example Ag—Ni alloy, Ag—Cu alloy, Ag—Pd alloy, Ag—Al alloy. Silver is well known to be solderable. Aluminum (Al) is poorly solderable so that the conductive powder can contain not much of Al, for example 30 wt % as the maximum, based on the total weight of the conductive powder.

In an embodiment, the conductive powder particles can be spherical in shape. The spherical powder can give superior adhesion to the bus electrode as shown in Examples below.

There is no restriction on the particle diameter of the conduction powder particles. The particle diameter of the conductive powder particles can be 0.5 to 5 μm in an embodiment, 0.6 to 3.5 μm in another embodiment, and 0.7 to 2.5 μm in still another embodiment, and 0.9 to 1.9 μm in yet another embodiment. The conductive paste containing the conductive powder with the particle diameters in these ranges can form a thick-film electrode of 1 to 10 μm thick.

The particle diameter is obtained by measuring the distribution of the particle diameters by using a laser diffraction scattering method. The median which is 50th percentile of the particle size distribution as measured by volume is defined as D50 to represent the particle diameter. Microtrac model X-100 is an example of the commercially-available devices that can be used for this measurement.

The conductive powder can be not more than 96 wt %, based on the total weight of the conductive powder, the glass frit and the organic polymer. The conductive powder can be at least 75 wt % in one embodiment, at least 78 wt % in a second embodiment, at least 84 wt % in yet another embodiment and at least 89 wt % in still another embodiment, based on the total weight of the conductive powder, the glass frit and the organic polymer.

The conductive powder can be 19 to 68 wt % in an embodiment, 31 to 65 wt % in another embodiment and 39 to 61 wt % in still another embodiment, based on the total weight of the conductive paste.

Glass Frit

The glass frit functions to help in sintering the conductive powder or to increase the adhesion of the thick-film electrode to the substrate.

The chemical composition of the glass frit here is not limited. Any glass frit can be suitable for use in the conductive paste. For example, a lead-boron-silicon glass or a lead-free bismuth glass frit can be used.

The glass frit can be 0.1 to 8 wt % in an embodiment, 0.2 to 5 wt % in another embodiment and 0.3 to 3 wt % in still another embodiment, based on the total weight of the conductive paste. With such amounts of glass frit, sintering the conductive powder and adhesion between the thick-film electrode and the substrate can be sufficient.

The glass frit can be 0.2 to 10 wt % in an embodiment, 0.5 to 6.2 wt % in another embodiment and 1.0 to 3.5 wt % in still another embodiment, based on the total weight of the conductive powder, the glass frit and the organic polymer. With such amounts of the glass frit, sintering the conductive powder and adhesion between the thick-film electrode and the substrate can be sufficient.

In an embodiment, the softening point of the glass frit can be 390 to 600° C. When the softening point is in the range, the glass frit could melt properly to obtain the effects mentioned above.

Organic Polymer

The organic polymer is used as a binder in combination with the solvent to form "paste" having suitable viscosity for applying on a substrate with a desired pattern. The organic polymer can be mostly removed during the firing by being burned out or carbonized.

There is no restriction on the type of the organic polymer. A wide variety of inert viscous materials can be used as the organic polymer. In an embodiment, the organic polymer can comprise ethyl cellulose, ethylhydroxyethyl cellulose, wood rosin, epoxy resin, phenolic resin, acrylic resin or a mixture thereof. In another embodiment, the organic polymer can be ethylcellulose.

The organic polymer is 3.5 to 12.5 wt % based on the total weight of the conductive powder, the glass frit and the organic polymer. The organic polymer can be at least 3.6 wt % in another embodiment, at least 3.9 wt % in still another embodiment and at least 4.0 wt % in yet another embodiment, based on the total weight of the conductive powder, the glass frit and the organic polymer. The organic polymer can be 10 wt % or less in another embodiment, 9.2 wt % or less in still another embodiment and 7.5 wt % or less in yet another embodiment, based on the total weight of the conductive powder, the glass frit and the organic polymer. When the organic polymer is in these ranges, the solder adhesion of the thin electrode can increase as shown in the Examples below.

The organic polymer can be 2 to 10 wt % in an embodiment, 2.5 to 8 wt % in another embodiment and 3 to 6 wt % in still another embodiment, based on the total weight of the conductive paste. When the organic polymer is in these ranges, the conductive paste has a viscosity suitable to the applying method.

Solvent

The solvent is used mainly to adjust the viscosity of the conductive paste. The solvent is evaporated during firing or during drying when the drying is carried out before firing.

The solvent is chosen in view of boiling point and solubility of the organic polymer. The solvent boiling temperature can be 50 to 250° C. in an embodiment. In an embodiment, the solvent can comprise texanol, ester alcohol, terpineol, kerosene, dibutylphthalate, butyl carbitol, butyl carbitol acetate, or hexylene glycol. The solvent can be terpineol which is commonly used in another embodiment.

The solvent can be 28 to 72 wt % in an embodiment, 31 to 61 wt % in another embodiment, 33 to 56 wt % in another embodiment, based on the total weight of the conductive paste. When the solvent is in the range, the conductive paste could have a viscosity suitable to the applying method for forming a thin electrode.

Additive

In addition to the materials above, an organic additive such as a thickener, a stabilizer, an emulsifier, and a viscosity modifier or an inorganic additive such as a metal oxide, for example a powder of titan oxide ($TiO_2$), copper oxide (CuO), bismuth oxide ($Bi_2O_3$) and zinc oxide (ZnO) can be added to the conductive paste. Multiple types of additives can be used. Type and amount of the additives can be chosen by people in the industry, in view of desired characteristics such as preservation stability, printability, or resulting electrical property.

EXAMPLES

The present invention is illustrated by, but is not limited to, the following examples. The thick-film electrode was formed on a semiconductor substrate having the insulating layer. The thick-film electrode in the Example was a supposed solar cell bus electrode.

Preparation of the Thick-Film Electrode

A conductive paste containing the conductive powder, the glass frit, and the organic medium was prepared by using the following materials and procedure. The amounts of the materials are shown in Table 1. Weight percent (wt %) is herein based on the total weight of the conductive paste unless otherwise mentioned.

Conductive powder: spherical silver (Ag) powder with particle diameter (D50) of 1.1 μm in average.

Glass frit: Pb—B—Si glass frit with softening point (Ts) 465° C.

Organic polymer: Ethylcellulose

Solvent: Terpineol

The Ag powder and the glass frit were dispersed into the mixture of ethylcellulose and terpineol and mixed for 15 minutes to form the conductive paste. When ell mixed, the conductive paste was repeatedly passed through a 3-roll mill for at progressively increasing pressures from 0 to 400 psi. The degree of the dispersion was measured by fineness of grind (FOG). A typical FOG value was adjusted to 20/10 or less.

The conductive paste obtained above was screen printed by a thick film printer (MC212, C. W. Price Co. Inc.) onto an insulating layer of a silicon nitride ($SiN_x$) formed on a semiconductor substrate of silicon through a 250 mesh screen mask with line patterns, 2 mm wide, 34 mm long and 80 μm thick. The semiconductor substrate was square 38 mm on a side. The printing pressure was 10 psi and down-stop was changed from 0 to 100 μm to control printing thickness.

The printed conductive paste was dried at 150° C. for 5 minutes in an oven.

The thick-film electrode was obtained by firing the dried conductive paste in a furnace (CF-7210, Despatch industry) at peak temperature setting with 945° C. The furnace set peak temperature of 945° C. corresponded to a measured temperature at the upper surface of the silicon substrate of 750° C. Firing time from entrance to exit of the furnace was 60 seconds. The firing setting condition was, 400 to 600° C. for 12 seconds, and over 600° C. for 6 seconds. The belt speed of the furnace was 550 cpm.

The thickness of the thick-film electrodes after firing was 5.0±0.2 μm.

Measurement of Solder Adhesion

Adhesion of the thick-film electrode was measured by the following procedures. A copper ribbon coated with a Sn/Pb solder (Uibrich Stainless Steels&Special Metals, Inc.) was dipped into a soldering flux (Kester-952s, Kester, Inc. and then dried for five seconds in air. Half of the solder coated copper ribbon was placed on the electrode and soldering was done by a soldering system (SCB-160, SEMTEK Corporation Co., Ltd.). The soldering iron setting temperature was 220 to 240° C. and the actual temperature of the soldering iron at the tip was from 195° C. to 215° C. measured by K-type thermocouple.

The rest part of the copper ribbon which did not adhere to the thick-film electrode was horizontally folded and pulled at 120 mm/min by a machine (Peel Force 606, MOGRL Technology Co., Ltd.). The strength (Newton, N) at which the copper ribbon was detached was recorded as the solder adhesion of the thick-film electrode.

Results

The adhesion of Example 1 to 3 were over three times higher than the adhesion of Comparative (Com.) Example 1 to 3 which was just 0.5 N as shown in Table 1. The adhesion of the thick-film electrode with thickness of 5 μm was sufficiently high when the Ag powder was 87.4 to 90.1 wt % of the total weight of the Ag powder, the glass frit and the organic polymer.

TABLE 1

| Composition (wt %) | Com. Example 1 | Com. Example 2 | Com. Example 3 | Example 1 | Example 2 | Example 3 |
|---|---|---|---|---|---|---|
| Ag powder | 45.0 | 45.0 | 45.0 | 45.0 | 45.0 | 45.0 |
| Glass frit | 0.8 | 0.8 | 0.8 | 0.8 | 0.8 | 0.8 |
| Organic polymer | 10.5 | 8.8 | 7.2 | 5.7 | 4.2 | 4.2 |
| Solvent | 43.8 | 45.5 | 47.1 | 48.6 | 50.0 | 50.1 |
| Total | 100.0 | 100.0 | 100.0 | 100.0 | 100.0 | 100.0 |
| Organic polymer/ (Ag + Glass + Polymer)* | 18.6 | 16.1 | 13.6 | 11.1 | 8.5 | 8.3 |
| Adhesion (N) | 0.5 | 0.5 | 0.5 | 1.8 | 5.3 | 4.8 |

*Organic polymer weight percent (%) is based on the total weight of the Ag powder, the glass frit and the organic polymer.

In turn, effect of the particle diameter of the conductive powder was examined. The thick-film electrode of 4 μm thick was formed on a silicon wafer with no $SiN_x$ layer as well as on the $SiN_x$ layer with a conductive paste composition as shown in Table 2. The particle diameter of the Ag powder here was 1.0, 1.1, 1.9 and 3.0 μm respectively. The composition of the conductive paste was 59 wt % of the Ag powder, 1.0 wt % of the glass frit, 3.6 wt % of the organic polymer, and 36.4 wt % of the solvent, based on the total weight of the conductive paste. The organic polymer was 5.6 wt % based on the total weight of the Ag powder, the glass frit and the organic polymer.

The formation method of the thick-film electrode and the measurement method of adhesion were the same as Example 1.

The adhesion of the thick-film electrode formed on the Si wafer and $SiN_x$ respectively was superior in the range of Examples 4 to 7 as shown in Table 2.

TABLE 2

| Composition (wt %) | | Example 4 | Example 5 | Example 6 | Example 7 |
|---|---|---|---|---|---|
| Ag particle diameter | | 1.0 | 1.1 | 1.9 | 3.0 |
| Adhesion | On Si wafer | 4.2 | 5.8 | 4.1 | 1.2 |
| | On $SiN_x$ layer | 3.9 | 7.0 | 4.0 | 0.9 |

What is claimed is:

1. A method of manufacturing a thick-film electrode comprising steps of:
    applying onto a substrate a conductive paste comprising a conductive powder, a glass frit, an organic polymer, and a solvent, wherein the organic polymer is 3.5 to 12.5 weight percent (wt %) based on the weight of the conductive powder, the glass frit, and the organic polymer, and wherein the conductive powder is 31 to 65 wt %, the glass frit is 0.1 to 8 wt %, the organic polymer is 2 to 8 wt %, and the solvent is 31 to 61 wt %, based on the total weight of the conductive paste;
    firing the applied conductive paste to form the thick-film electrode, wherein thickness of the thick-film electrode is 1 to 10 μm; and
    soldering, the thick-film electrode.

2. The method of claim 1, wherein the conductive powder comprises a metal selected from the group consisting of silver (Ag), nickel (Ni), copper (Cu), gold (Au), platinum (Pt), palladium (Pd), aluminum (Al) and a mixture thereof.

3. The method of claim 1, wherein the conductive powder is spherical powder.

4. The method of claim 1, wherein particle diameter of the conductive powder is 0.5 to 5 μm.

5. The method of claim 1, wherein the substrate is a semiconductor substrate.

6. The method of claim 5, wherein the semiconductor substrate comprises a semiconductor layer and an insulating layer on at least one side surface of the semiconductor layer.

7. The method of claim 5, wherein the thick-film electrode is a solar cell electrode.

8. A method of manufacturing a solar cell comprising steps of:
    preparing a silicon wafer having a front side and a back side, wherein an insulating layer comprising silicon nitride ($SiN_x$), titanium oxide ($TiO_2$), aluminum oxide ($Al_2O_3$), silicon oxide ($SiO_2$), or indium tin oxide (ITO) is formed on the front side,
    applying onto at least either of the front side and the back side a conductive paste comprising a conductive powder, a glass frit, an organic polymer, and a solvent, wherein the organic polymer is 3.5 to 12.5 weight percent (wt %) based on the weight of the conductive powder, the glass fit, and the organic polymer, and wherein the conductive powder is 31 to 65 wt %, the glass frit is 0.1 to 8 wt %, the organic polymer is 2 to 8 wt %, and the solvent is 31 to 61 wt %, based on the total weight of the conductive paste;
    firing the applied conductive paste to form the thick-film electrode as a bus electrode of the solar cell, wherein thickness of the thick-film electrode is 1 to 10 μm; and
    soldering the thick-film electrode with a wire to electrically connect the solar cell to another solar cell.

9. A conductive paste to form a thick-film electrode with 1 to 10 μm thickness comprising a conductive powder, a glass frit, an organic polymer, and an solvent, wherein organic polymer is 15 to 12.5 weight percent (wt %) based on the weight of the conductive powder, the glass frit and the organic polymer, wherein the conductive powder is 31 to 65 wt %, the glass frit is 0.1 to 8 wt %, the organic polymer is 2 to 8 wt %, and the solvent is 31 to 61 wt %, based on the total weight of the conductive paste.

10. The method of claim 4, wherein the particle diameter of the conductive powder is 0.9 to 1.9 μm.

11. The method of claim 8, wherein particle diameter of the conductive powder is 0.9 to 1.9 μm.

12. The conductive paste of claim 9, wherein particle diameter of the conductive powder is 0.9 to 1.9 μm.

* * * * *

UNITED STATES PATENT AND TRADEMARK OFFICE
CERTIFICATE OF CORRECTION

| | |
|---|---|
| PATENT NO. | : 8,815,638 B2 |
| APPLICATION NO. | : 13/915681 |
| DATED | : August 26, 2014 |
| INVENTOR(S) | : Kazutaka Ozawa |

It is certified that error appears in the above-identified patent and that said Letters Patent is hereby corrected as shown below:

In the Specification

Column 3, Line 30, please change "ell" to read -- cell --.

Column 8, Line 37, please change "ell" to read -- well --.

Column 8, Line 67, please change "Uibrich" to read -- Ulbrich --.

In the Claims

Column 10, Claim 9, line 4, please change "polymer is 15" to read -- polymer is 3.5 --.

Signed and Sealed this
Third Day of February, 2015

Michelle K. Lee
*Deputy Director of the United States Patent and Trademark Office*